United States Patent
Hansen et al.

(10) Patent No.: US 7,230,481 B2
(45) Date of Patent: Jun. 12, 2007

(54) SYSTEM AND METHOD FOR REDUCING AUDIBLE ARTIFACTS IN AN AUDIO SYSTEM

(75) Inventors: Thomas Holm Hansen, Værløse (DK); Kim Nordtorp Madsen, Skovlunde (DK); Claus Niels Neesgaard, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 180 days.

(21) Appl. No.: 11/122,435

(22) Filed: May 5, 2005

(65) Prior Publication Data

US 2006/0261886 A1 Nov. 23, 2006

(51) Int. Cl.
*H03F 1/14* (2006.01)
(52) U.S. Cl. ...................... 330/51; 330/124 R
(58) Field of Classification Search ............... 330/10, 330/51, 9, 251, 207 A, 124 R, 295; 381/94.5
See application file for complete search history.

(56) References Cited

U.S. PATENT DOCUMENTS 5,872,481 A * 2/1999 Sevic et al. ................ 330/51
6,137,355 A * 10/2000 Sevic et al. ................ 330/51
6,784,744 B2 * 8/2004 Tichauer .................... 330/285

* cited by examiner

*Primary Examiner*—Henry Choe
(74) *Attorney, Agent, or Firm*—W. James Brady, III; Frederick J. Telecky, Jr.

(57) ABSTRACT

An amplifier system can include a biasing amplifier that provides a first amplified signal to a DC blocking element that is connected with a load based on a first control signal. A power amplifier provides a second amplified signal for driving the load based on a second control signal. A control system controls the biasing amplifier to charge the DC blocking element so as to mitigate a voltage drop across the load (e.g., to substantially eliminate audible artifacts) when the power amplifier is activated to provide the second amplified signal.

20 Claims, 3 Drawing Sheets

SYSTEM AND METHOD FOR REDUCING AUDIBLE ARTIFACTS IN AN AUDIO SYSTEM

TECHNICAL FIELD

The present invention relates to electronic circuits, and more specifically, to a system and method for reducing audible artifacts in an audio system.

BACKGROUND

Transient signals in an electrical circuit can cause a number of problems in certain applications. Transient signals that have sufficiently high voltage or current can damage electrical circuitry or otherwise adversely affect performance of one or more components. A transient voltages is usually the result of a sudden, sharp change in voltage across a circuit component that is often is associated with initiating power to a load. In some applications, transient signals may not damage components, but nonetheless provide undesirable effects and/or reduce performance.

In a number applications, particularly relating to audio systems, it is desirable to eliminate or substantially reduce transient voltages across certain loads to reduce adverse impacts of such transient voltage on performance. Click/pop is one such undesirable result of transient voltages. Click/pop is an unpleasant audible artifact provided by a speaker, which is often heard when an audio system powers up or powers down. Click/pop is generally caused by a transient voltage drop (e.g., a DC offset mismatch) across a speaker that may occur when a power amplifier transitions between a non-switching mode and a switching mode.

The audibility of click/pop does not depend only on the energy involved, but also on how the energy spectrum is shaped. While click/pop is most often heard when the audio amplifier system is powered on, click/pop can also occur when the audio system is powered down, or when the audio system changes mode. The mode changes include changing from surround mode to stereo mode, or from stereo to mono mode or between different surround sound modes.

SUMMARY

The present invention relates generally to a system and method for reducing audible artifacts in an audio system. One aspect of the present invention provides an amplifier system that includes a biasing amplifier that provides a first amplified signal to a DC blocking element that is connected with a load (e.g., a speaker) based on a first control signal and a power amplifier that provides a second amplified signal for driving the load based on a second control signal. A control system controls the biasing amplifier to charge the DC blocking element so as to mitigate a voltage drop across the load when the power amplifier is activated to provide the second amplified signal. By mitigating the voltage drop across the load, audible artifacts (e.g., click/pop) can be reduced or eliminated in an audio system. The amplifier system can include any number of one or more audio channels to which the first amplified signal is applied to reduce audible artifacts.

Another aspect of the present invention provides an amplifier system that includes means for providing an amplified biasing signal to a DC blocking element that is coupled with a speaker and means for providing an amplified output signal for providing power to the speaker. The amplifier system also includes means for controlling the means for providing the amplified biasing signal to reduce a voltage drop across the speaker when the amplified output signal is provided, whereby audible artifacts (e.g., click/pop) provided by the speaker are mitigated.

Another aspect of the present invention provides a method for controlling power delivered to a load, such as a speaker. The method includes activating a biasing amplifier to provide a biasing signal in response to detecting a mode change, and precharging a DC blocking element based on the biasing signal. A power amplifier is activated to provide an amplified output signal to a load after the precharging is substantially complete, such that a voltage drop across the load (e.g., a speaker) is mitigated when the amplified output signal is provided. The reduction in the voltage drop across the load operates to mitigate audible artifacts (e.g., click/pop) in an audio system.

DETAILED DESCRIPTION

The present invention relates to mitigating audible artifacts associated with energizing a load, and more specifically, to reducing click/pop during mode changes in an audio system. The click/pop is mitigated by reducing a voltage mismatch that appears across a speaker, such when the audio system changes modes (e.g., during power up or power down). The reduction of the voltage drop across the speaker is accomplished by biasing a DC blocking element so that there is no (or very little) DC offset across the speaker before and after a mode change. The biasing can be implemented independently of leakage currents and mismatches in components used in the audio system, including DC blocking elements, biasing resistors and the like. Since the DC voltage offset at both nodes of a speaker have a substantially equal voltage (e.g., corresponding to 0V DC offset) before a power amplifier is activated and after the power is activated, click/pop is mitigated.

Figure 1:
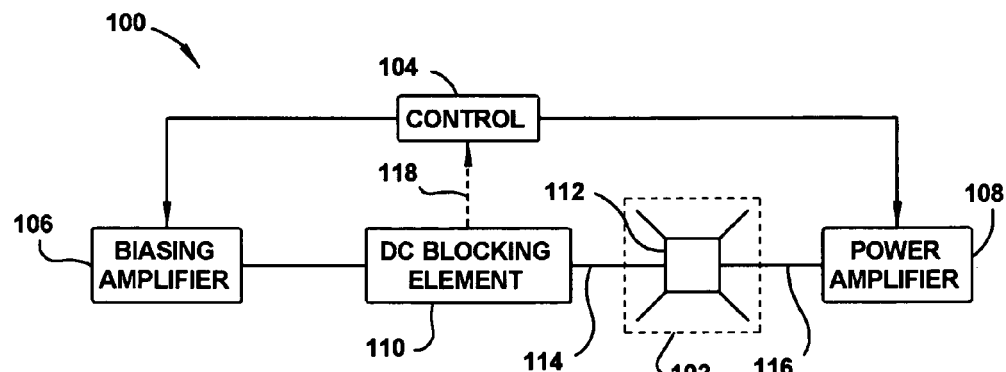
FIG. 1 illustrates a block diagram of an amplifier system in accordance with an aspect of the invention.

FIG. 1 illustrates an amplifier system 100 for mitigating transient signals across a load 102. A controller 104 provides a first control signal to a biasing amplifier 106. The controller 104 also provides second control signal to a power amplifier 108. Each of the amplifiers 106 and 108 may be, for example, a class D or switching amplifier. Other classes of amplifiers (e.g., class B, class AB, or class C) can also be employed for the amplifiers 106 and 108, and each may be the same or different type of amplifier.

A DC blocking element 110 is connected in series with the load 102 between the biasing amplifier 106 and the power amplifier 108. Other components (not shown) can also be connected between the respective amplifiers 106 and 108. The DC blocking element 110 may be implemented, for example, as a split capacitor (two capacitors connected in series between ground and the power supply voltage), a single capacitor, or a resistor network. The load 102 for an audio application corresponds to a resistive load, namely a speaker 112.

The controller 104 is programmed and/or configured to provide the first control signal to the biasing amplifier 106 to provide a first amplified output signal to the DC blocking element 110. The controller 104 can activate the biasing amplifier 106 in response to an impending mode change, such as may require the power amplifier 108 to be activated (e.g. from a non-switching mode to a switching mode). For purposes of the following example, it is assumed that the power amplifier 108 is a switching (or class D) amplifier. Thus, the impending mode change can correspond to the power amplifier change from a non-switching mode to a switching mode. The biasing amplifier is activated so that the voltage at node 114 (between the load 102 and the DC blocking element 110) substantially matches the voltage at node 116 (between the load 102 and the power amplifier 108).

After the biasing amplifier provides the first amplified signal for a time period, the controller 104 provides the second control signal to the power amplifier 108 to activate and provide a second amplified output signal to the load 102. The time period for activating the biasing amplifier 106 prior to activating the power amplifier 108 can correspond to a predetermined time period (e.g., approximately 1–10 seconds). Alternatively, the time period can vary according to the amount of time required for charging the node 114 to a predetermined voltage (e.g., one-half a positive power supply input voltage (PVDD/2)). For instance, feedback, indicated at 118 may be provided to the controller 104 providing an indication of the voltage at the node 114, such as corresponding to the voltage across the DC blocking element 110. The controller 104 can be implemented as a microcontroller, a digital signal processor or a state machine that is configured to control the amplifiers, such as described herein.

The controller 104 can also provide the first control signal to the biasing amplifier 106 to deactivate the biasing amplifier. The controller 104 can deactivate the biasing amplifier 106, for example, after the power amplifier 108 has been activated to provide the load 102 with the second amplified output signal. Thus, there may be a period of overlap when the biasing amplifier 106 is activated concurrently with the power amplifier 108. Alternatively, the controller 104 can deactivate the biasing amplifier 106 concurrently with activation of the power amplifier 108 to provide the second amplified output signal to the load 102. The controller 104 may deactivate the biasing amplifier 106 immediately or it may control the biasing amplifier to provide a gradual reduction in the voltage of the first amplified output signal. The amplifier system 100 may include programmable features that allow a user to select the amount of overlap between operation of the biasing amplifier 106 and the power amplifier 108, as well as control the duration or conditions that cause the biasing amplifier to be deactivated.

When the biasing amplifier 106 provides the DC blocking element 110 the amplified output signal, the biasing amplifier 106 precharges the DC blocking element 110. Such precharging ensures that when the controller 104 provides the second control signal to activate the power amplifier 108 to provide the second amplified output signal to the load 102, there is no significant voltage drop across the load 102, thus substantially reducing or eliminating transient voltages across the load 102. With the transient voltages reduced or eliminated, certain audio artifacts, such as click/pop, can also be reduced or eliminated.

Figure 2:
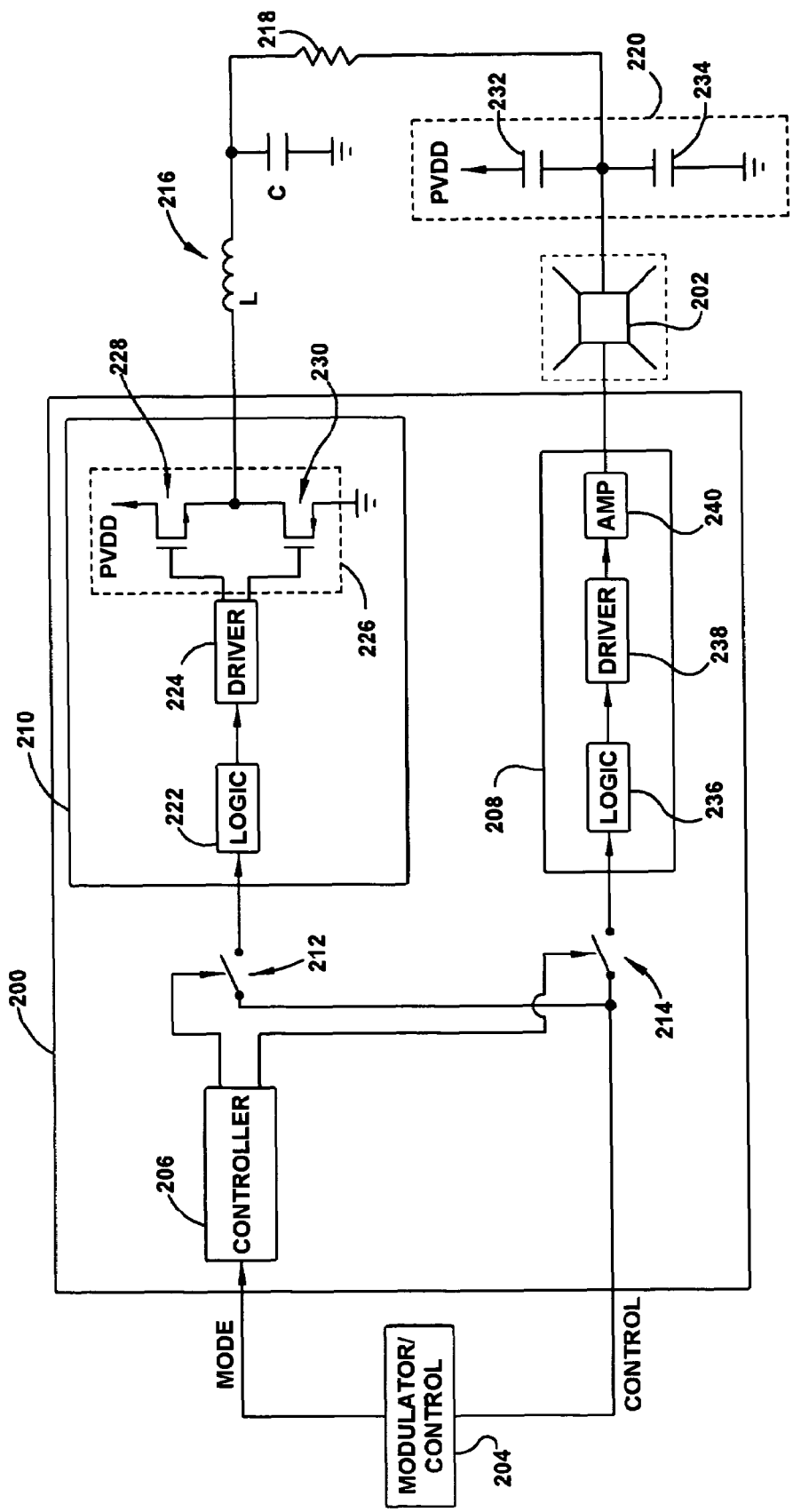
FIG. 2 illustrates another example of an amplifier system in accordance with an aspect of the invention.

FIG. 2. illustrates another example of an amplifier system 200 for reducing offset across a load 202 in accordance with an aspect of the present invention. A modulator/controller 204 is connected to the amplifier system 200. The amplifier system 200 includes a controller 206, a power amplifier 208 and a biasing amplifier 210. The amplifier system 200 may be fabricated on a single integrated circuit (IC) chip. For purposes of the following example, the amplifier system corresponds to an audio amplifier in which the power amplifier 208 is an audio amplifier associated with a respective audio channel.

The modulator/controller 204 provides a MODE signal to the controller 206. For instance, the modulator/controller 204 can provide the MODE signal to indicate a mode change for the amplifier system, such as to power-up or power down or to change between different active audio modes. The modulator/controller 204 also provides a CONTROL signal to the amplifiers 208 and 210. In the example of FIG. 2, the modulator/controller 204 is connected to the amplifiers 208 and 210 through corresponding switch devices 214 and 212, respectively. The controller 206 can control the state of the switch devices 212 and 214 based on the MODE signal. Thus, the state of the switch devices 212 and 214 determines whether the CONTROL signal from the modulator/control 204 is supplied to each of the amplifiers 208 and 210. While a single control signal is depicted in FIG. 2, it is to be understood and appreciated that separate signals can be provided to each of the amplifiers 208 and 210, such as when different types or configurations of amplifiers are implemented.

By way of example, the CONTROL signal corresponds to a PWM signal having alternating high and low levels and a duty cycle. The PWM signal may be a signal in the range of approximately 300–600 kHz. The duty cycle of the PWM signal will vary according to the operating mode of the system 200 and whether an audio signal is being modulated onto the CONTROL signal. At a mode change, assuming that no audio signal is being injected, the modulator/controller 204 can provide the CONTROL signal as a PWM signal having a 50% duty cycle. The controller 206 is operative to control the first and second switches 212 and 214 according to the operating mode of the amplifier system 200 indicated by the MODE signal. After associated power supply circuitry and the circuitry of the modulator/controller 204 has stabilized (e.g., at power up), the MODE signal causes the controller 206 to activate the first switch to a closed condition to couple the CONTROL signal to the input of the biasing amplifier 210. The biasing amplifier 210 provides the amplified switching signal to charge a DC blocking element 220 to a desired voltage.

After a time period, which may be predetermined or vary according to the charge characteristics of the DC blocking element 220, the controller 206 to closes the second switch 214 for providing the CONTROL signal to the power amplifier 208. The specifics on how and when the CONTROL signal is supplied to the respective amplifiers 208 and 210 can be implemented in the controller 206, in the modulator/controller 204 or in both the controller and the modulator/controller. As one example, the modulator/controller 204 can control the controller 206 via changes in the MODE signal (e.g., one or more bits). In such a case, the MODE signal indicates to the controller to close the second switch 214. In another example, the controller 206 includes a timing function that is activated in response to the MODE signal. In that case, the controller 206 can close the second switch 214 a predetermined amount of time after controller 206 closes the first switch 212. The controller 206 can control the first and second switches 212 and 214 so that the switches operate mutually exclusively (e.g., no overlap between closed conditions) or such that there is predetermined amount of overlap between closed conditions of the respective switches.

An optional filter 216 can be coupled in series with a resistor 218, which is connected between the DC blocking element 220 and the biasing amplifier 210. The filter 216 can be an LC filter configured to filter electrical noise or other undesirable high frequency signals (e.g., switching noise) associated with the biasing amplifier 210. The load 202 is connected between the DC blocking element 220 and the power amplifier 208. The load 202 typically is a resistive load comprising one or more speakers as well as associated circuitry.

The biasing amplifier 210 can be implemented as a class D amplifier, although other classes of amplifiers can also be utilized. As an example, the biasing amplifier 210 may include logic circuitry 222 that provides a timing control signal to an output driver 224 according to the CONTROL signal from the modulator/controller 204. The logic circuitry 222, for example, can include a combination of switch devices and logic gates that decodes the input PWM signals as well as controls the rising-edge and falling-edge dead time of the power stage transistors (e.g., power field effect transistors) as well as correct timing asymmetry that other blocks in the PWM signal path might cause. The logic circuitry 222 provides the timing-compensated signals to the output driver 224. The output driver 224 provides drive signals to control an output stage 226. For example, the output driver 224 can include a high-side driver and a low-side driver for controlling respective transistors, namely a low-side transistor 228 and a high-side transistor 230 of the output stage 226. That is, the output stage corresponds to a half-bridge, although other amplifier topologies could be used.

The output stage 226 is coupled to drive the DC blocking element 220 with an amplified output signal according to the operation of the output driver 224. The output stage 226 provides the amplified output signal, for example, as pulse-width-modulated signal having an amplitude that varies between PVDD and electrical ground according to the frequency and duty cycle signal indicated by the CONTROL signal. By way of further example, when the transistors 228 and 230 are switching, the average voltage output is determined by the on-time versus off-time of the output stage 226. In particular, the switching of the transistors 228 and 230 is controlled by the low-side and high-side drive signals.

In the example of FIG. 2, the DC blocking element 220 is depicted as a split-capacitor network having a first capacitor 232 connected in series with a second capacitor 234 between PVDD and electrical ground. The juncture between the capacitors corresponds to a mid-point node. The biasing amplifier 210 thus operates as an active bias circuit that can "pull in" the voltage at the mid-point node between the capacitors 232 and 234 to a desired value independent of leakage currents, capacitor mismatch and other operating parameters and process variations. For instance, when the bias half-bridge is switching at 50% duty cycle, the split-cap midpoint voltage can be "pulled in" to the desired value with a time constant that is determined by the combined split-cap capacitance and the series resistor 218. By setting the mid-point node to the desired voltage prior to activating the power amplifier audio artifacts from the load speaker 202, such as click/pop, can be reduced or eliminated.

Since the switching can be controlled from the modulator/control block 204, the timing in the output stage 226 can be substantially identical to the timing of the power amplifier 208. If the timing integrity in the bias half-bridge tracks the timing of the audio channels, the average output voltage on the bias-half-bridge will be substantially identical to the average voltage of the audio channels. It is will be understood that a single biasing amplifier 210 can be utilized for biasing a DC blocking element associated with a plurality of different audio channels (e.g., in a multi-channel audio system).

The power amplifier 208 may be configured similarly to the biasing amplifier 210. Briefly stated, the power amplifier 208 includes logic circuitry 236, a driver 238, and an output stage 240 that cooperate to provide an amplifier output signal based on the CONTROL signal. For instance, by implementing each of the amplifiers 208 and 210 as switching amplifiers, a common PWM signal (e.g., the CONTROL signal) can be utilized to control each of the amplifiers and common pins and circuitry can be shared. Further efficiencies can be achieved since, as mentioned above, substantially the same timing can be implemented with respect to each of the amplifiers 208 and 210.

As mentioned above, the controller 206 controls the state of the second switch 214 based on the MODE signal. That is, after the controller has activated the first switch 212 to a closed condition, the controller 206 activates the second switch 214 to a closed condition to couple the CONTROL signal to the power amplifier 208. The controller 206 can control the relative operation of the first and second switches based on a variety of conditions. For example, the controller can delay activation of the second switch 214 from when the first switch 212 is activated a predetermined amount of time (e.g., about 1–10 seconds). This duration may be programmable, such as by setting a programmable register. Alternatively or additionally, the controller can be configured to delay activating the second switch 214 until the DC blocking element 220 reaches a predetermined voltage (e.g., PVDD/2). After the second switch 214 is closed, the power amplifier 208 provides a second amplified output signal to the load 202 based on the CONTROL signal. The duty cycle of the CONTROL signal determines whether the amplifier delivers the output signal as a common mode voltage with no audio signal or an amplified audio signal. Since the biasing amplifier 210 has been activated to pull in the voltage at the DC blocking element 220, namely the mid-point voltage, to a desired value (e.g., PVDD/2), when the power amplifier is activated to drive the load 202 based on the CONTROL signal, audible artifacts are reduced or eliminated.

The controller 206 also deactivates the first switch 212, which can be implemented concurrently with the activation of the second switch 214 or it can be implemented after the second switch is activated. If the first switch 212 is deactivated after the second switch 214, the amount of overlap when the CONTROL signal is provided to both amplifiers 208 and 210 can be fixed or variable. The deactivation of the first switch 212 may include a gradual decrease in the voltage of the first amplified output signal. The amplifier system 200 may include programmable features that allow one to select the one or more parameters relating to the function and timing of the biasing amplifier 210 relative to the power amplifier 208.

Figure 3:
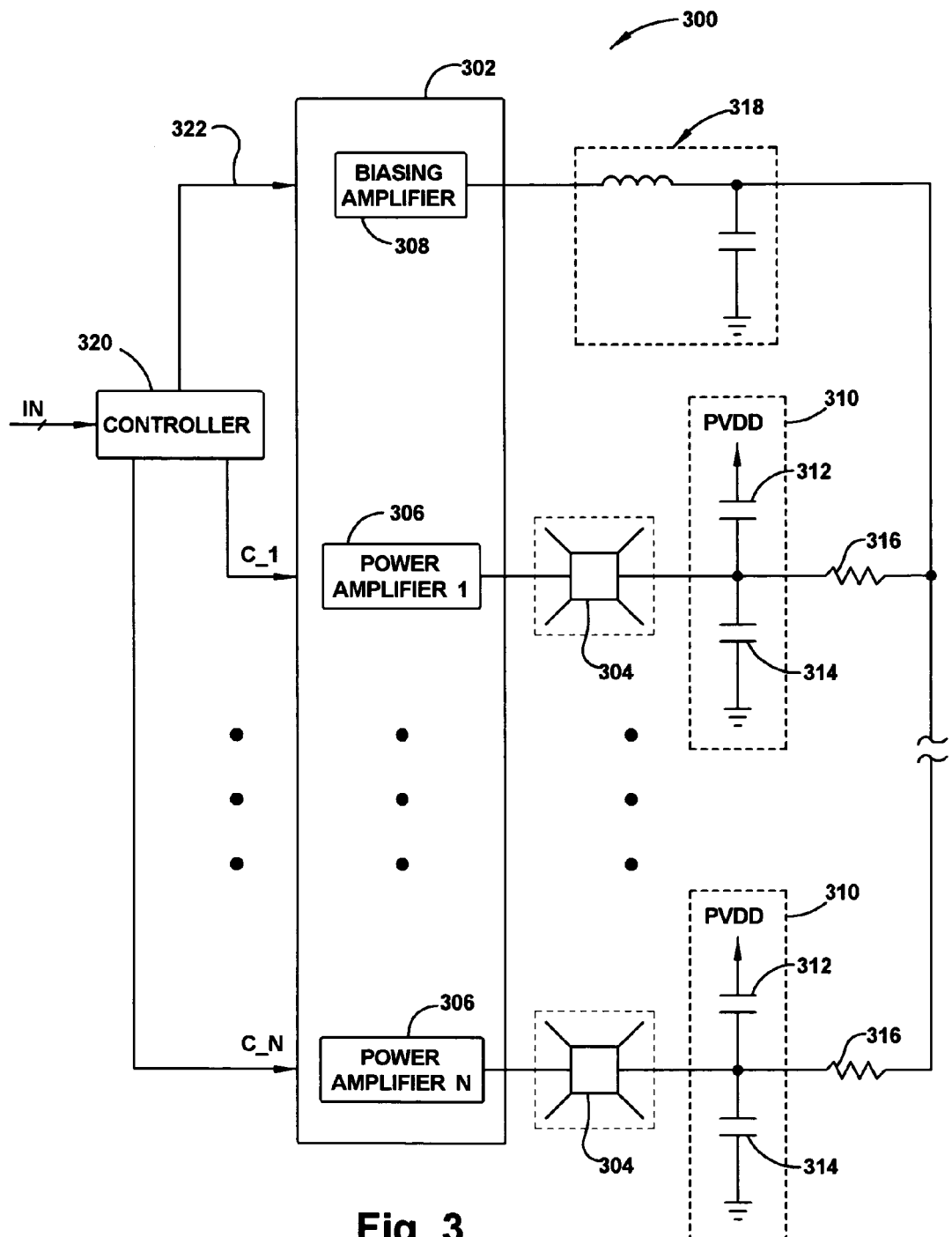
FIG. 3 illustrates another example of an amplifier system in accordance with an aspect of the invention.

FIG. 3 illustrates an example of part of a multi-channel audio system 300 that can be implemented in accordance with an aspect of the invention. For example, the multi-channel audio system 300 can correspond to a surround sound system. In the example of FIG. 3, the audio system is configured in multi-channel single-ended output configuration, although the present invention is equally applicable to other modes, such as bridge tied load output configuration.

The audio system 300 includes an amplifier system 302 that is operative to provide multi-channel amplified audio to a plurality of loads, namely speakers 304. The amplifier system 302 includes an associated power amplifier 306 that provides amplified audio for each audio channel, represented as POWER AMPLIFIER 1 through POWER AMPLIFIER N, where N is a positive integer greater than 1 denoting the number of audio channels. The amplifier system 302 also includes a biasing amplifier 308 that is operative to mitigate audible artifacts for each audio channel during start-up or reset of the audio system, such as can occur at power-up, power-down, or a mode change. The amplifier system 302 may be fabricated on a single IC chip.

DC blocking elements 310 are employed in series with the speakers to facilitate channel separation. In the example of FIG. 3, the DC blocking elements 310 are implemented as respective split-cap decoupling components for each of the output channels. The split-cap decoupling components include first and second capacitors 312 and 314 connected between PVDD and electrical ground, with the mid-point of each split cap connected to the respective speaker 304. An external resistor 316 is connected in series with each of the DC blocking elements 310 to facilitate precharging of the DC blocking elements. For example, the resistors 316 and the combined split-cap capacitance for each channel define a pre-charge time constant for each respective channel. The resistors 316 and capacitors 312 and 314 can be selected to define a time constant for the precharging procedure, which resistor values may vary according to timing, accuracy and power dissipation requirements (e.g., in the range from about 10Ω to about 10 kΩ).

The biasing amplifier 308 is connected to provide a biasing signal to pre-charge the DC blocking elements 310 to a predetermined voltage before the audio channels are activated. An optional demodulation (LC) filter 318 can be implemented at the output of the biasing amplifier 308 to reduce high-frequency signal components in the biasing signal. While a single biasing amplifier 308 is depicted in FIG. 3 for precharging each of the respective DC blocking elements 310, it is to be understood that the amplifier system 302 could alternatively include separate biasing amplifiers for each of the output channels.

A control system 320 controls the amplifier system 302. For example, the control system can control the precharge procedure via a first control signal 322. The first control signal 322, for example, can indicate that the system has been reset, such as may occur when a master clock to the control system 320 has been lost, if a mute function has been enabled in the control system, if the audio system changes audio modes (e.g., different surround sound modes) to name a few. The control system also provides control signals for each of the audio channels, indicated at C_1 through C_N, which can vary according to an INPUT signal(s). The control system 320 can be implemented as a PWM processor that designed to interface with the amplifier system 302 and generate PWM output signals C_1 through C_N for each of the respective channels. The control system 320 may also include a microcontroller, if needed, to implement the precharge procedure.

At a mode change, the control system 320 can provide the signal 322 such that the biasing amplifier is activated to supply the bias signal to precharge the DC blocking elements 310 to a desired voltage. For example, the biasing amplifier 308 can supply a PWM signal having a duty cycle and frequency (e.g., corresponding to one of the audio channel control signals C_1 through C_N) to charge the mid-point node of the split-capacitor network 312, 314 to PVDD/2. The control system 320 further can control switching start/stop by outputting a predetermined switching sequence from which the biasing amplifier 308 generates the bias signal for precharging the DC blocking elements with a properly shaped energy spectrum. After a time period, which may be predetermined or vary according to the charge characteristics of the DC blocking elements 310, the power amplifiers 306 can be activated to supply corresponding audio output signals to the respective speakers 304.

The respective amplifiers 306 and 308 can be operated mutually exclusively (e.g., no overlap between their operation) or such that there is predetermined amount of overlap between operation of the biasing amplifier and the power amplifiers 306. For example, the control system (or other circuitry) 320 can delay activation of the power amplifiers 306 after the biasing amplifier 308 has been activated for a predetermined amount of time (e.g., about 1–10 seconds). This duration may be programmable, such as by setting a programmable register. Alternatively or additionally, activation of the power amplifiers 306 can be delayed until one or more of the DC blocking elements 310 reaches a predetermined voltage (e.g., PVDD/2). The delay can be implemented by circuitry within the control system, circuitry in the amplifier system 302 or a combination of circuitry in the control system and amplifier system. The duty cycle of the C_1 through C_N signals determines whether each of the speakers 304 receives a common mode voltage with no audio signal or an amplified audio signal. By activating the biasing amplifier 308 to pull in the voltage at the DC blocking elements 310 (e.g., the mid-point voltage to a desired value, such as to PVDD/2), when the power amplifiers 306 are activated, audible artifacts (click/pop) can be reduced or eliminated.

Figure 4:
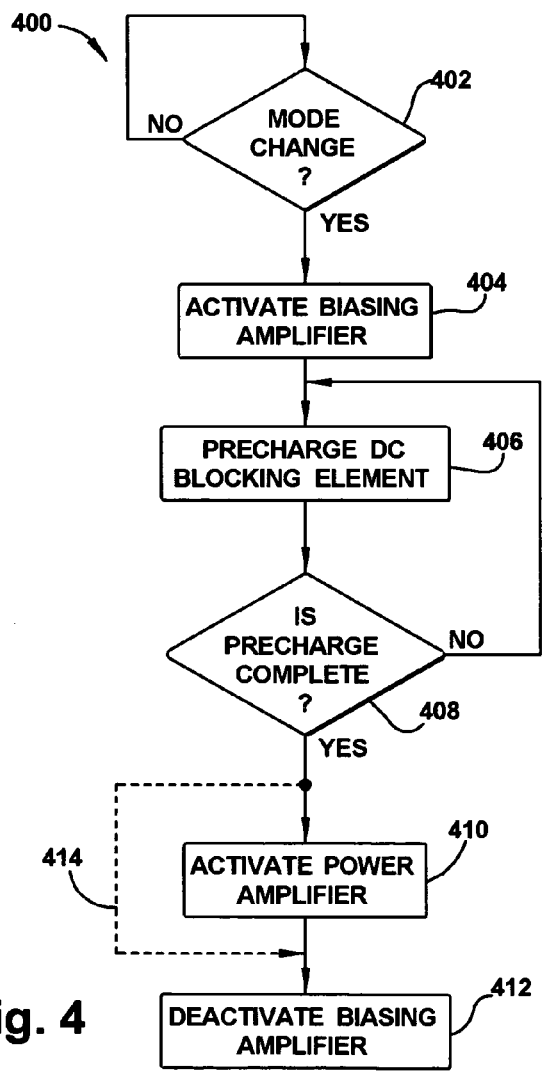
FIG. 4 illustrates a flow diagram of a method that can be utilized to control power delivered to a load in accordance with an aspect of the invention.

FIG. 4 illustrates a flow diagram of a method 400 that can be utilized to control power delivered to one or more loads, such as speakers, in accordance with an aspect of the invention. For example, the method can be implemented by an audio system that includes an amplifier system, such as for providing single or multi-channel audio. At 402, a determination is made as to whether a mode change has occurred, such as might result in a DC offset occurring across one or more speakers. A mode change can include, for example, an audio system being powered up or down, a master clock for the system being lost, a mute function being enabled or disabled, changing audio modes (e.g., different surround sound modes) to name a few.

At 404, a biasing amplifier is activated to provide a biasing signal. At 406, the one or more DC blocking elements are precharged according to the biasing signal. For example, the biasing signal can be provided as a PWM signal having a duty cycle designed to precharge the one or more DC blocking elements to a desired voltage. For example, the biasing signal can provide a desired shaped waveform for charging the DC blocking element to PVDD/2 or other level that will mitigate a DC offset when an associated power amplifier provides power to the one or more speakers.

At 408, a determination is made as to whether or not the precharge sequence is complete. The determination can include, for example, determining whether the precharge sequence has occurred for a predetermined amount of time (e.g., 1–10 seconds), or determining whether the DC blocking element has reached the predetermined voltage that will mitigate DC offset when power is supplied to the one or more speakers. If the precharge is not complete (NO), the method returns to 406 to continue the precharge sequence. However, if the precharge is complete (YES), then the method proceeds from 408 to 410. At 410, one or more power amplifiers is activated to supply power to the one or more associated speakers. The supply of power may or may not include audio. At 412, the biasing amplifier is deactivated. The deactivation of the biasing amplifier can occur concurrently with the activation of the power amplifier (indicated by dashed line 414) or, alternatively, it can occur after the power amplifier has been activated. The timing relationship between deactivation of the biasing amplifier at 412 and the activation of the one more power amplifiers can vary depending on application requirements, and further may be programmable.

What have been described above are examples of the present invention. It is, of course, not possible to describe every conceivable combination of components or methodologies for purposes of describing the present invention, but one of ordinary skill in the art will recognize that many further combinations and permutations of the present invention are possible. Accordingly, the present invention is intended to embrace all such alterations, modifications, and variations that fall within the spirit and scope of the appended claims.

What is claimed is:

1. An amplifier system comprising:
    a biasing amplifier that provides a first amplified signal to a DC blocking element that is connected with a load based on a first control signal;
    a power amplifier that provides a second amplified signal for driving the load based on a second control signal; and
    a control system that controls the biasing amplifier to charge the DC blocking element so as to mitigate a voltage drop across the load when the power amplifier is activated to provide the second amplified signal.

2. The amplifier system as claimed in claim 1, wherein the control system controls the biasing amplifier to provide the first amplified signal for a duration before the power amplifier is activated to provide the second amplified signal.

3. The amplifier system as claimed in claim 1, wherein the first amplified signal is provided after a predetermined amount of time after the providing of the second amplified signal.

4. The amplifier system as claimed in claim 1, wherein the DC blocking element comprises a DC blocking capacitor.

5. The amplifier system as claimed in claim 1, wherein the DC blocking element comprises a split-capacitor network having a mid-point node connecting a pair of capacitors between a first voltage and a second voltage, the load being coupled between the mid-point node and the power amplifier.

6. The amplifier system as claimed in claim 1, wherein a resistor is connected between the biasing amplifier and the DC blocking element, the DC blocking element and the resistor being selected to define a time constant associated with precharging the DC blocking element to the predetermined voltage.

7. The amplifier system as claimed in claim 6, wherein the load comprises a speaker, whereby audible artifacts provided by the speaker are mitigated when the second amplified signal is provided to the speaker.

8. The amplifier system of claim 1, further comprising a modulation/control system that provides the first and second control signals as a pulse-width modulated input signals, the modulation control system also providing a mode signal, the control system controlling activation of the biasing amplifier and the power amplifier based on the mode signal.

9. The amplifier system of claim 8, wherein the first and second control signals comprise the same pulse-width modulated input signal.

10. The amplifier system as claimed in claim 1, further comprising:
    a plurality of power amplifiers, each of the plurality of power amplifiers providing an amplified output signal for driving a respective load based on corresponding input signal; and
    a plurality of DC blocking elements, each of the plurality of DC blocking elements being coupled with a respective load, the control system controlling the biasing amplifier to charge each of the plurality of DC blocking elements so as to mitigate a voltage drop across each respective load when each of the power amplifiers is activated to provide the amplified output signals.

11. The amplifier system as claimed in claim 10, wherein each of the plurality of loads comprises a speaker associated with each power amplifier.

12. The amplifier system as claimed in claim 10, wherein at least the biasing amplifier and the plurality of power amplifiers are implemented on a single integrated circuit chip.

13. An amplifier system comprising:
    means for providing an amplified biasing signal to a DC blocking element that is coupled with a speaker;
    means for providing an amplified output signal for providing power to the speaker; and
    means for controlling the means for providing the amplified biasing signal to reduce a voltage drop across the speaker when the amplified output signal is provided, whereby audible artifacts provided by the speaker are mitigated.

14. The amplifier system as claimed in claim 13, wherein the means for controlling is configured to activate the means for providing the amplified biasing signal based on a mode signal indicative of a mode change for the amplifier system.

15. The amplifier system of claim 13, wherein the DC blocking element comprises a split-capacitor network having a mid-point node connecting a pair of capacitors between a first voltage and a second voltage, the speaker being coupled between the mid-point node and the means for providing an amplified output signal.

16. The amplifier system of claim 13, further comprising means for providing at least one pulse-width modulated input signal, wherein the means for providing an amplified biasing signal provides the amplified biasing signal based on the at least one pulse-width modulated input signal and the means for providing an amplified output signal provides the amplified output signal based on the at least one pulse-width modulated input signal.

17. A method for controlling power delivered to a load, the method comprising:
    activating a biasing amplifier to provide a biasing signal in response to detecting a mode change;
    precharging a DC blocking element based on the biasing signal;
    activating a power amplifier to provide an amplified output signal to a load after the precharging is substantially complete, such that a voltage drop across the load is mitigated when the amplified output signal is provided.

18. The method as claimed in claim 17, wherein the first amplified output signal is provided a predetermined amount of time after the second amplified output signal.

19. The method as claimed in claim 17, further comprising deactivating the biasing amplifier to stop providing the biasing signal, the biasing amplifier being deactivated one of concurrently with the activation of the power amplifier or after activation of the power amplifier.

20. The method as claimed in claim 17, further comprising providing at least one pulse-width modulated input signal, wherein the biasing signal is provided with a duty cycle that varies based on the at least one pulse-width modulated input signal and the amplified output signal is provided based on the at least one pulse-width modulated input signal.

* * * * *